(12) United States Patent
Zou et al.

(10) Patent No.: US 12,704,981 B2
(45) Date of Patent: Aug. 11, 2026

(54) METHODS OF VOLTAGE REGULATION, ELECTRONIC APPARATUSES AND STORAGE MEDIA

(71) Applicant: Yangtze Memory Technologies Co., Ltd., Wuhan (CN)

(72) Inventors: Yusheng Zou, Wuhan (CN); Congjian Pei, Wuhan (CN); Xiaodong Xu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 88 days.

(21) Appl. No.: 18/761,287

(22) Filed: Jul. 1, 2024

(65) Prior Publication Data

US 2025/0173069 A1 May 29, 2025

(30) Foreign Application Priority Data

Nov. 28, 2023 (CN) ......................... 202311624705.6

(51) Int. Cl.
*G06F 3/06* (2006.01)
*G11C 5/14* (2006.01)

(52) U.S. Cl.
CPC .......... *G06F 3/0625* (2013.01); *G06F 3/0634* (2013.01); *G06F 3/0673* (2013.01); *G11C 5/147* (2013.01)

(58) Field of Classification Search
CPC .... G06F 3/0625; G06F 3/0634; G06F 3/0673; G11C 5/147
See application file for complete search history.

(56) References Cited

U.S. PATENT DOCUMENTS

2005/0144486 A1* 6/2005 Komarla ............... G06F 1/3203 713/300
2019/0065089 A1* 2/2019 Myers .................. G06F 3/0625
2022/0197519 A1* 6/2022 Kuo ..................... G06F 3/0634

* cited by examiner

*Primary Examiner* — Terrell S Johnson
(74) *Attorney, Agent, or Firm* — Fish & Richardson P.C.

(57) ABSTRACT

The present disclosure provides methods, electronic apparatuses and storage media for voltage regulation. An example method includes acquiring a current working state of the memory system, and reducing a voltage provided to the memory system in response to the current working state being a light-load working state.

20 Claims, 6 Drawing Sheets

METHODS OF VOLTAGE REGULATION, ELECTRONIC APPARATUSES AND STORAGE MEDIA

CROSS-REFERENCE TO RELATED APPLICATIONS

This application claims priority to Chinese Patent Application No. 202311624705.6, filed on Nov. 28, 2023, which is hereby incorporated by reference in its entirety.

TECHNICAL FIELD

The present disclosure relates to the technical field of power consumption management, and particularly to a method of voltage regulation, an electronic apparatus and a storage medium.

BACKGROUND

At present, electronic apparatuses have become an indispensable part of modern life. However, with the rapid development of mobile technology, the industry pays more and more attention to energy-saving performance of the electronic apparatuses. High energy consumption will have a negative impact not only on the environment, but also on the use experience and use cost of users.

SUMMARY

Examples of the present disclosure provide a method of voltage regulation, an electronic apparatus and a storage medium.

In a first aspect, a method of voltage regulation is provided. The method of voltage regulation is applied to an electronic apparatus comprising a memory system, and comprises: acquiring a current working state of the memory system, wherein the working state comprises a light-load working state and a heavy-load working state; and reducing a voltage provided to the memory system in response to the current working state being the light-load working state.

In some examples, the electronic apparatus further comprises a power management IC, and reducing the voltage provided to the memory system comprises: sending a first voltage adjustment instruction to the power management IC; and reducing the voltage provided to the memory system from a standard working voltage to a lower limit working voltage by the power management IC in response to the first voltage adjustment instruction.

In some examples, the memory system comprises a memory controller and a memory, and the voltage provided to the memory system comprises a first power supply voltage provided to the memory controller and a second power supply voltage provided to the memory. Reducing the voltage provided to the memory system from the standard working voltage to the lower limit working voltage comprises: reducing the first power supply voltage provided to the memory controller from a standard working voltage of the first power supply voltage to a lower limit working voltage of the first power supply voltage, and reducing the second power supply voltage provided to the memory from a standard working voltage of the second power supply voltage to a lower limit working voltage of the second power supply voltage, by the power management IC.

In some examples, reducing the voltage provided to the memory system from the standard working voltage to the lower limit working voltage further comprises: reducing the second power supply voltage provided to the memory from the standard working voltage of the second power supply voltage to zero, and reducing the first power supply voltage provided to the memory controller from the standard working voltage of the first power supply voltage to the lower limit working voltage of the first power supply voltage, by the power management IC.

In some examples, before acquiring the current working state of the memory system, the method further comprises: acquiring the current working state of the memory system in response to not sending an operating instruction to the memory system within a preset time threshold, wherein the operating instruction is to instruct the memory system to enter the heavy-load working state.

In some examples, acquiring the current working state of the memory system comprises: sending a state information acquisition instruction to the memory system, and acquiring state information fed back by the memory system; and determining the working state of the memory system according to the state information.

In some examples, after reducing the voltage provided to the memory system, the method further comprises: sending a second voltage adjustment instruction to the power management IC in response to at least one of the operating instruction sent to the memory system or the state information fed back by the memory system being the heavy-load working state; and adjusting the voltage provided to the memory system from the lower limit working voltage to the standard working voltage by the power management IC in response to the second voltage adjustment instruction.

In some examples, the light-load working state comprises a plurality of sub-working states including a standby state, a hibernate state, an idle state, a sleep state and a deep sleep state, wherein lower limit working voltages corresponding to different ones of the sub-working states are different.

In a second aspect, an electronic apparatus is provided, which comprises a memory system; and at least one processor coupled with the memory system, wherein the at least one processor is configured to: acquire a current working state of the memory system, wherein the working state comprises a light-load working state and a heavy-load working state; and reduce the voltage provided to the memory system in response to the current working state being the light-load working state.

In some examples, the electronic apparatus further comprises a power management IC coupled with the at least one processor, wherein the at least one processor is configured to send a first voltage adjustment instruction to the power management IC, and the power management IC is configured to reduce the voltage provided to the memory system from a standard working voltage to a lower limit working voltage in response to the first voltage adjustment instruction.

In some examples, the voltage provided to the memory system comprises a first power supply voltage provided to the memory controller and a second power supply voltage provided to the memory, and the power management IC is configured to reduce the first power supply voltage provided to the memory controller from a standard working voltage of the first power supply voltage to a lower limit working voltage of the first power supply voltage, and reduce the second power supply voltage provided to the memory from a standard working voltage of the second power supply voltage to a lower limit working voltage of the second power supply voltage.

In some examples, the power management IC is further configured to reduce the second power supply voltage provided to the memory from the standard working voltage of the second power supply voltage to zero, and reduce the first power supply voltage provided to the memory controller from the standard working voltage of the first power supply voltage to the lower limit working voltage of the first power supply voltage.

In some examples, the at least one processor is further configured to acquire the current working state of the memory system in response to not sending an operating instruction to the memory system within a preset time threshold, wherein the operating instruction is to instruct the memory system to enter the heavy-load working state.

In some examples, the at least one processor is configured to send a state information acquisition instruction to the memory system, and acquire state information fed back by the memory system; and determine the working state of the memory system according to the state information.

In some examples, the at least one processor is further configured to send a second voltage adjustment instruction to the power management IC in response to at least one of the operating instruction sent to the memory system or the state information fed back by the memory system being the heavy-load working state, wherein the second voltage adjustment instruction is configured to instruct the power management IC to adjust the voltage provided to the memory system from the lower limit working voltage to the standard working voltage.

In some examples, the light-load working state comprises a plurality of sub-working states including a standby state, a hibernate state, an idle state, a sleep state and a deep sleep state, wherein lower limit working voltages corresponding to different ones of the sub-working states are different.

In a third aspect, a computer readable storage medium is provided, which stores a computer executable instruction that, after being executed, can implement a method of any example in the above first aspect.

DETAILED DESCRIPTION

Figure 1:
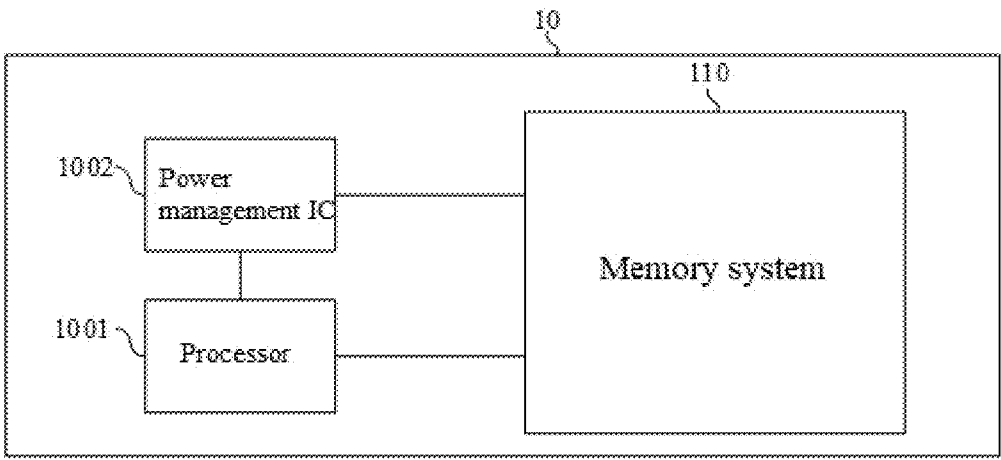
FIG. 1 is a block diagram of an electronic apparatus provided by examples of the present disclosure.

The technical solutions in some examples of the present disclosure will be described below clearly and completely in conjunction with the drawings. Apparently, the examples described are only part of, but not all of, the examples of the present disclosure. All other examples obtained by those of ordinary skills in the art based on the examples provided by the present disclosure should fall in the scope of protection of the present disclosure.

Unless otherwise specified in the context, throughout the specification and the claims, the term "comprise" is interpreted as an open and inclusive meaning, i.e., "including, but not limited to". In the description of the specification, the terms "one embodiment", "some embodiments", "an exemplary embodiment", "exemplarily" or "some examples", etc. are intended to indicate that particular features, structures, materials, or characteristics related to the example are included in at least one example of the present disclosure. The schematic representation of the above terms may not necessarily refer to the same example. Furthermore, these particular features, structures, materials, or characteristics may be included in one or more examples in any suitable manner.

In the following, the terms "first" and "second" are only for the purpose of description, and cannot be construed as indicating or implying relative importance or implicitly indicating the number of indicated technical features. Thus, features defined by "first" and "second" may explicitly or implicitly include one or more of such features. In the description of the examples of the present disclosure, "a plurality of" means two or more, unless otherwise stated.

In describing some examples, expressions of "coupled" and derivatives thereof may be used. For example, the term "coupled" may be used in the description of some examples to indicate that two or more components have a direct physical contact or an electrical contact. In this case, "coupled" may be also described as "connected". Moreover, the term "coupled" may also mean that two or more components have no direct contact with each other, but still cooperate or interact with each other. The examples disclosed herein are not necessarily limited to the content herein.

"At least one of A, B and C" and "at least one of A, B or C" have the same meaning, both include the following combinations of A, B and C: A alone, B along, C alone, a combination of A and B, a combination of A and C, a combination of B and C, and a combination of A, B and C.

"A and/or B" includes the following three combinations: A alone, B alone, and a combination of A and B. The use of "suitable for" or "configured to" herein means open and inclusive language, and does not exclude an apparatus suitable for performing or configured to perform additional tasks or steps. In addition, the use of "based on" means openness and inclusiveness, as processes, steps, calculations, or other actions "based on" one or more conditions or values may be based on an additional condition or exceeded value in practice.

The use of "configured to" herein means open and inclusive language, and does not exclude an apparatus suitable for performing or configured to perform additional tasks or steps.

Examples of the present disclosure provide an electronic apparatus that may be, for example, any one of a cellphone, a desktop computer, a tablet computer, a notebook computer, a server, a vehicle apparatus, a wearable apparatus (e.g., a smart watch, a smart bracelet, smart glasses, etc.), a mobile power supply, a game console, a digital multimedia player, etc. With reference to FIG. 1, an electronic apparatus 10 comprises a processor 1001, a power management IC (PMIC) 1002 and a memory system 110, wherein the processor 1001 is coupled with the memory system 110, and the processor 1001 is coupled with the power management IC 1002.

In the above implementations, the processor and the power management IC may be disposed on the same mainboard (physical space or physical carrier), while the memory system is disposed on another mainboard. It is to be noted that there are multiple possibilities in relative position relationships among the processor, the power management IC and the memory system, for example, the processor, the power management IC and the memory system may be all disposed on the same mainboard. The present disclosure does not impose specific limitations to the relative position relationships among the processor, the power management IC and the memory system.

Figure 2:
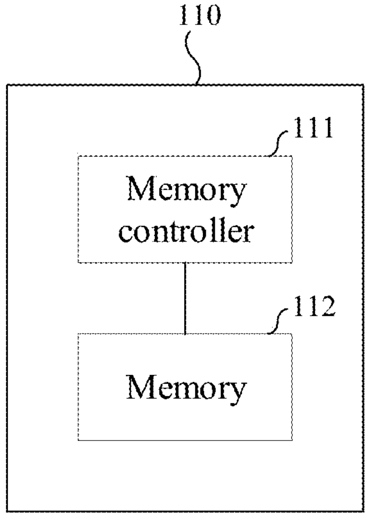
FIG. 2 is a block diagram of a memory system provided by examples of the present disclosure.

In an example, with reference to FIG. 2, FIG. 2 shows a schematic diagram of the memory system 110 provided by examples of the present disclosure. The memory system 110 comprises a memory controller 111 and a memory 112, wherein the memory controller 111 is coupled to the memory 112 to control the memory 112 to store data. The memory 112 may be a 2-dimensional (2D) memory or a 3-dimensional (3D) memory.

The memory system 110 may be integrated into various types of storage apparatuses, for example, be included in the same package (e.g., a Universal Flash Storage (UFS) package or an Embedded Multi Media Card (eMMC) package). That is, the memory system 110 may be applied to and packaged into different types of mobile electronic products, for example, a mobile phone (e.g. a cellphone), a desktop computer, a tablet computer, a notebook computer, a server, a vehicle apparatus, a gaming console, a printer, a positioning apparatus, a wearable apparatus, a smart sensor, a mobile power supply, a Virtual Reality (VR) apparatus, an Augmented Reality (AR) apparatus, or any other suitable electronic apparatuses having memories therein.

In some examples, the memory system 110 comprises a memory controller 111 and one memory 112, and may be integrated into a memory card. The memory card includes any one of a Personal Computer Memory Card International Association (PCMCIA) card (a PC card for short), a Compact Flash (CF) card, a Smart Media (SM) card, a memory stick, a Multi Media Card (MMC), a Secure Digital (SD) memory card and a UFS.

At present, the electronic apparatuses have become an indispensable part of modern life. In order to improve the battery life, the power consumption of the electronic apparatus needs to be reduced, and the overall power consumption of the electronic apparatus can be reduced by reducing the power consumption of conventional systems such as a display system, a communication system, etc. The memory system has multiple working states. In some working states, the memory system needs to perform data processing operation, and therefore, a normal working voltage needs to be maintained. However, in some other working states, the memory system does not need to perform the data processing operation, and therefore does not need a very high voltage. But these states are not regulated for the power, leading to high power consumption of the memory system in these states and to high overall power consumption of the electronic apparatus. Therefore, when the memory system does not perform a data processing operation, the power consumption of the memory system needs to be reduced, so as to reduce the overall power consumption of the electronic apparatus.

In order to solve the above problem, examples of the present disclosure provide a solution: a voltage provided to the memory system is regulated dynamically according to the working state of the memory system, such that when the memory system is in a light-load working state, the overall power consumption of the electronic apparatus is reduced by reducing the power consumption of the memory system in the electronic apparatus.

The memory system in the electronic apparatus may comprise multiple types. The present disclosure is illustrated with the types of EMMC and UFS. EMMC and UFS are mainly used to store an operating system, an application, a media file and other data of the electronic apparatus.

The EMMC has the main characteristics of low power consumption, small size, low cost and relatively slow data transfer speed, and is mainly used for low-end electronic apparatuses. The UFS is a more advanced memory technology and provides higher data transfer speed and lower delay.

By optimizing power consumption management of the memory system, not only may a longer battery life be provided, but also an overheat risk of the apparatus during high load use can be reduced. This is of great significance to meet daily demands of a user, improve the usability of the electronic apparatus and provide better user experience. Therefore, during a design and manufacturing process of the electronic apparatus, it is critical to pay attention to the power consumption of the memory system, such that the memory system may present obvious performance and efficiency advantages in practical use.

The multiple working states of the memory system may comprise a heavy-load working state and a light-load working state, wherein the heavy-load working state may comprise at least one of the following: the memory system being performing operations corresponding to a read instruction, a write instruction and an erase instruction, etc. sent by the processor, and the memory system being performing a garbage collection (GC) operation. The light-load working state characterizes that the memory system runs under a relative low load condition, and does not perform data read, write and erase operations.

In some examples, the heavy-load working state may be also called an active working state, and the light-load working state may be also called an inactive working state. Of course, the present disclosure only provides some examples of the named two working state. It should be understood that it is not limited to these two states in other examples, and its coverage scope should be determined by definitions of the two working states.

The light-load working state comprises a plurality of sub-working states, for example, a standby state, a hibernate state, an idle state, a sleep state and a deep sleep state. However, operations that are executable in each sub-working state are different, so corresponding lower limit working voltages are different, that is, the power consumption reduced by each sub-working state is different. Each sub-working state under the light-load working state will be illustrated below.

In an example, an illustration is made with the memory system as the UFS, and the light-load working state may comprise the following states:

- a hibernate state: when the processor and the memory system have no data to transmit, working states of data links of the processor and the memory system are both in the light-load working state, i.e., the hibernate state at this point;
- an idle state: when the UFS is idle, i.e., neither having a command sent from the processor nor having a background task to process by itself, the UFS is in the idle state;

a sleep state: the power consumption needs to be further reduced in the sleep state as compared with the idle state, and the UFS turns off most peripherals and clocks; and a deep sleep state: the power consumption needs to be further reduced in the deep sleep state as compared with the sleep state. In the sleep state and the deep sleep state, it only responds to a restart command and a sleep wake-up command. All other commands are ignored.

In an example, an illustration is made with the memory system as the EMMC, and its light-load working state may comprise a standby state and a sleep state.

Figure 3:
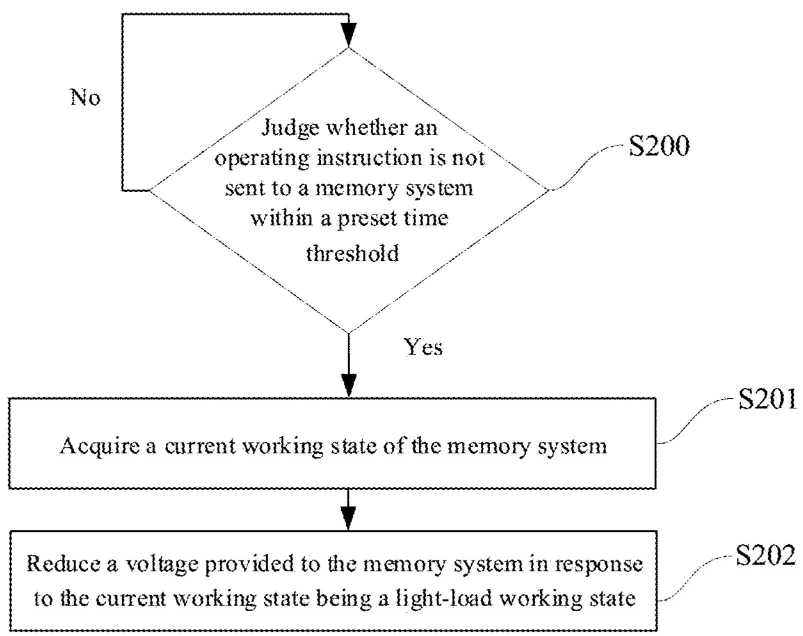
FIG. 3 is a flow diagram of a method of voltage regulation provided by examples of the present disclosure.

In an example, when the above-mentioned electronic apparatus 10 is in operation, a method of voltage regulation as shown in FIG. 3 is performed, and comprises S200-S202.

A process that the processor judges whether the memory system is in the light-load working state comprises two judgment conditions, wherein the first judgment condition is to judge whether the processor does not send a working instruction to the memory system for a long time. The second judgment condition is to judge whether the processor receives state information fed back by the memory system corresponding to the light-load working state.

With reference to FIG. 3, the method of voltage regulation provided by the examples of the present disclosure comprises:

S200: Judging whether an operating instruction is not sent to the memory system within a preset time threshold.

When the processor sends the operating instruction to the memory system, the operating instruction may comprise a read instruction, a write instruction and an erase instruction, etc. The read instruction, the write instruction and the erase instruction are to instruct the memory system to perform respective operations such as a data read operation, a data write operation and a data erase operation, etc., i.e., the operating instruction is to instruct the memory system to enter the heavy-load working state. However, when the processor does not send the operating instruction to the memory system within the preset time threshold, it means that the memory system does not perform the operations such as the data write operation, the data erase operation and the data read operation, etc. Only after the above condition is met, the processor will actively acquire the current working state of the memory system to determine the current working state of the memory system.

S201: Acquiring the current working state of the memory system.

In order to effectively optimize power consumption of the memory system, the processor needs to acquire the current working state of the memory system, and makes a respective voltage adjustment strategy according to the working state of the memory system. The working state of the memory system comprises the light-load working state and the heavy-load working state. The light-load working state characterizes that the memory system runs under a relative low load condition. In the light-load working state, a resource utilization rate of the memory system is relatively low, and the memory system does not perform data read, write and erase operations or performs a small amount of data read, write and erase operations. The heavy-load working state characterizes that the memory system runs under a heavy load condition. In the heavy-load working state, the resource utilization rate of the memory system is high, and the memory system may be faced with a large amount of data access requests or application activities, and therefore will perform a large amount of data read, write and erase operations.

Even if the processor does not send the operating instruction to the memory system within the preset time threshold, the memory system may be still executing the operating instruction previously sent by the processor, and the processor does not know whether the memory system has finished executing the operating instruction sent by the processor. Therefore, the processor needs to actively interact with the memory system so as to further determine the current working state of the memory system.

Figure 4:
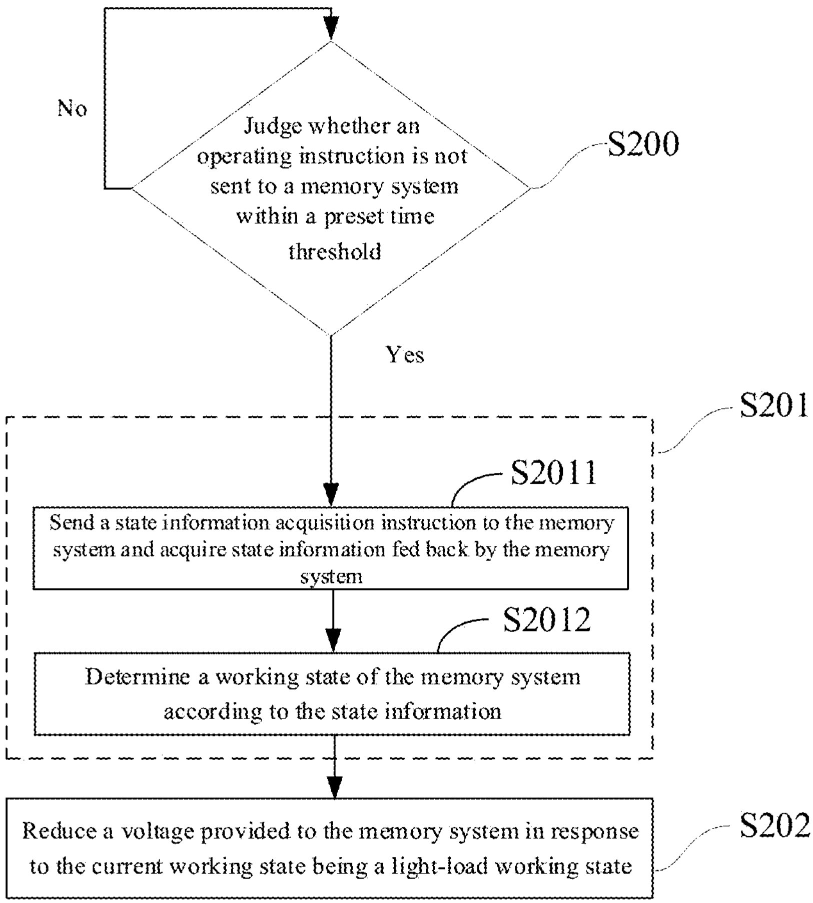
FIG. 4 is a flow diagram of another method of voltage regulation provided by examples of the present disclosure.

With reference to FIG. 4, in one possible implementation, acquiring the current working state of the memory system comprises:

S2011: Sending a state information acquisition instruction to the memory system and acquiring state information fed back by the memory system.

The processor communicates with the memory system through a preset data channel, and the processor first sends, to the memory system, the state information acquisition instruction that is for the purpose of acquiring register information characterizing detailed information of the current state of the memory system. The state information of the memory system is stored in a state register. Here, acquiring the state information of the memory system is actually achieved by acquiring the state information stored in the state register.

S2012: Determining the working state of the memory system according to the state information.

After the controller of the memory system receives the information acquisition instruction, the respective state register information is fed back according to the current actual state of the memory system. After the processor acquires the state register information, the working state of the memory system may be determined according to digital code information corresponding to the state register information by resolving the digital code information therein.

In an example, if the state information fed back by the memory system is first information, the first state information is used to indicate that the working state of the memory system is the heavy-load working state; if the state information fed back by the memory system is second information, the working state of the memory system is a hibernate state of the light-load working state; and if the state information fed back by the memory system is third information, the working state of the memory system is an idle state of the light-load working state, and so on.

S202: Reducing the voltage provided to the memory system in response to the current working state being the light-load working state.

In different working states, in order to meet working demands of the memory system, the voltage required for the operation of the memory system is different. Therefore, in different working states, the voltages provided to the memory system are different. For example, when the working state of the memory system is the light-load working state, the load is low, and the voltage required is lower than a standard working voltage. Therefore, when the memory system is in the light-load working state, reducing the voltage provided to the memory system does not have an impact on the normal data processing operation of the memory system, but the power consumption of the memory system can be reduced.

In an example, when the memory system is in the heavy-load working state, the required voltage is V1. When the memory system is in the light-load working state, the required voltage is V2, wherein $V2<V1$. According to the solution provided by the present disclosure, when the memory system is in the light-load working state, the voltage provided to the memory system may be reduced. Under the condition that the current is constant, the magnitude of power consumption is proportional to the magnitude of voltage. Therefore, the power consumption of the memory system in the light-load working state may be less than the power consumption in the heavy-load working state.

Figure 5:
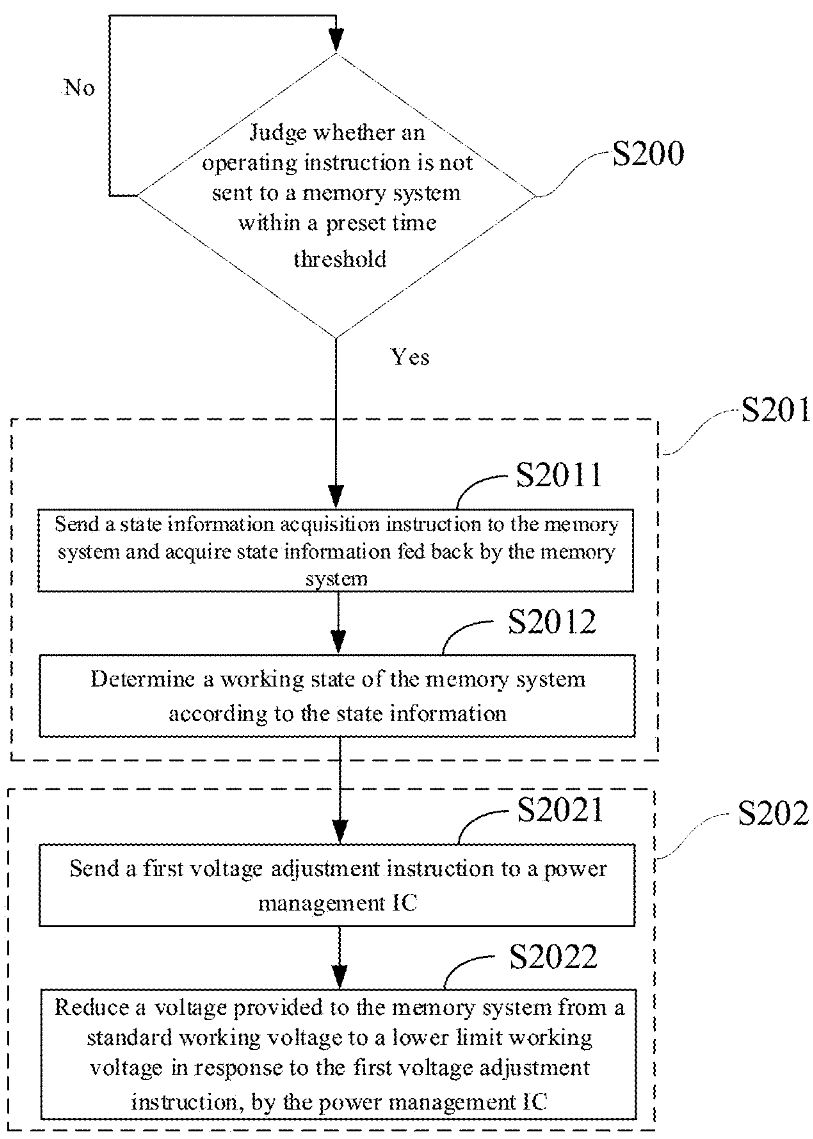
FIG. 5 is a flow diagram of another method of voltage regulation provided by examples of the present disclosure.

Voltage control of the memory system by the processor is achieved by the power management IC. With reference to FIG. 5, in one possible implementation, reducing the voltage provided to the memory system comprises:

S2021: Sending a first voltage adjustment instruction to the power management IC.

The processor sends the first voltage adjustment instruction to the power management IC through a preset data link, and the first voltage adjustment instruction is to instruct the power management IC to reduce the voltage provided to the memory system from the standard working voltage to the lower limit working voltage.

S2022: Reducing the voltage provided to the memory system from the standard working voltage to the lower limit working voltage by the power management IC in response to the first voltage adjustment instruction.

In an example, the processor sends the first voltage adjustment instruction to the power management IC which, after receiving the first voltage adjustment instruction, reduces the voltage provided to the memory system from the standard working voltage V3 to the lower limit working voltage V4. In the light-load working state, the performance requirements of the system are low, so that even if the input voltage is reduced from the voltage V3 to the voltage V4, there will be no negative impact on the normal operation of the memory system. This is because in the light-load working state, the resource utilization rate of the system is relatively low, and there are not a large amount of computing tasks or data processing requirements. Therefore, by the way of appropriate voltage reduction, the system can operate at higher energy efficiency, while its running requirements can be still met.

For different memory systems, due to a difference in their power supply structures, the voltages provided to the memory system may multiple, but at least comprise a first power supply voltage powering the memory controller and a second power supply voltage powering the memory.

In one possible implementation, reducing the voltage provided to the memory system from the standard working voltage to the lower limit working voltage comprises:

S20221: reducing the first power supply voltage provided to the memory controller from a standard working voltage of the first power supply voltage to a lower limit working voltage of the first power supply voltage, and reducing the second power supply voltage provided to the memory from a standard working voltage of the second power supply voltage to a lower limit working voltage of the second power supply voltage, by the power management IC.

The power supply of the memory system at least comprises two power supplies. One of the power supplies is used to provide required power to the memory controller, and another power supply is used to provide power to the memory.

Figure 6:
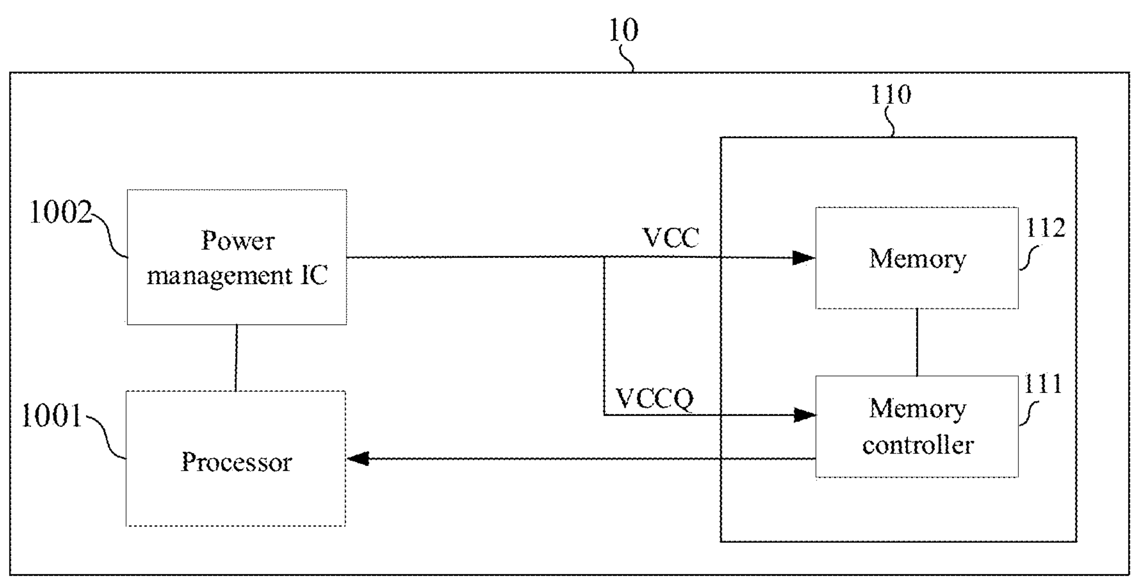
FIG. 6 is a schematic power supply diagram of an electronic apparatus provided by examples of the present disclosure.

In an example, with reference to FIG. 6, an illustration is made with the memory system as the UFS, and the voltage provided to the memory system comprises a first power supply voltage provided to the memory controller and a second power supply voltage provided to the memory, for example, the first power supply voltage may be VCCQ, and the second power supply voltage may be VCC.

It is to be noted that in different sub-working states of the light-load working state, the lower limit working voltages corresponding to VCCQ and VCC are different.

In an example, in the idle state, the lower working voltages of VCCQ and VCC may be 1.19 V and 2.48 V respectively; in the hibernate state, the lower limit working voltages of VCCQ and VCC may be 1.17 V and 2.45 V respectively; in the sleep state, the lower limit working voltages of VCCQ and VCC may be 1.15 V and 2.43 V respectively; and in the deep sleep state, the lower limit working voltages of VCCQ and VCC may be 1.14 V and 2.40 V respectively.

Figure 7:
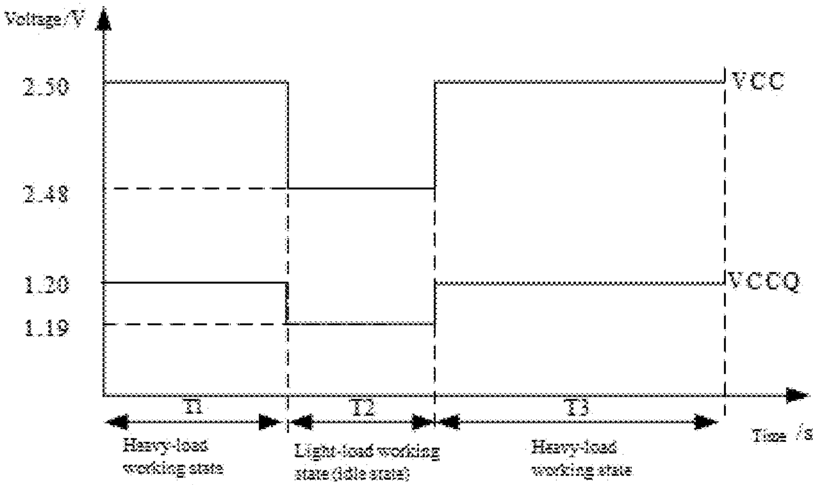
FIG. 7 is a schematic diagram of voltage waveform regulation provided by examples of the present disclosure.
Figure 8:
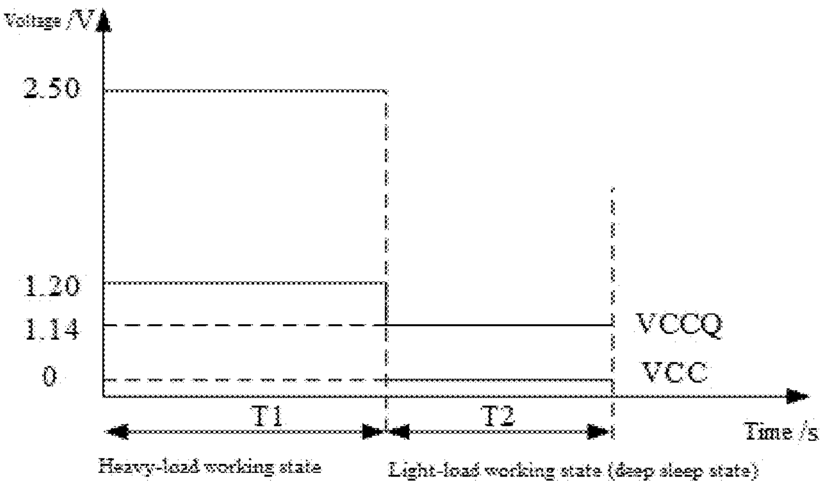
FIG. 8 is a schematic diagram of another voltage waveform regulation provided by examples of the present disclosure.

With reference to FIGS. 7 and 8, a voltage adjustment process of VCCQ and VCC will be mainly illustrated below.

With reference to FIG. 7, in a time period T1, when the working state of the memory system is the heavy-load working state, the VCCQ and VCC provided by the power management IC to the memory system are both standard working voltages, for example, VCCQ is 1.20 V, and VCC is 2.50 V.

In a time period T2, when the working state of the memory system is the idle state of the light-load working state, the VCCQ and VCC provided by the power management IC to the memory system are both lower limit working voltages of the idle state, for example, the lower limit working voltage of VCCQ corresponding to the idle state is 1.19 V, and the lower limit working voltage of VCC corresponding to the sleep state is 2.48 V.

In a time period T3, when the working state of the memory system is restored to the heavy-load working state, the VCCQ and VCC provided by the power management IC to the memory system are both standard working voltages, for example, VCCQ is 1.20 V, and VCC is 2.50 V.

In some cases, part of electronic apparatuses may cut off power supply to the memory in some light-load working states, for example, in the sleep state and the hibernate state, and only retain power supply to the memory controller, i.e., in such scenario, the lower limit working voltage of the second power supply voltage may be 0. However, in order to further reduce the power consumption of the memory system in the light-load working state, it may be achieved by reducing the power supply voltage provided to the memory controller.

In one possible implementation, reducing the voltage provided to the memory system from the standard working voltage to the lower limit working voltage further comprises:

S20222: reducing the second power supply voltage provided to the memory from the standard working voltage of the second power supply voltage to zero, and reducing the first power supply voltage provided to the memory controller from the standard working voltage of the first power supply voltage to the lower limit working voltage of the first power supply voltage, by the power management IC.

In an example, continuing the illustration with the memory system as the UFS, with reference to FIG. 8, the voltage provided to the UFS may comprise both VCC and VCCQ. In the time period T1, when the working state of the memory system is the heavy-load working state, the voltage provided by VCCQ and VCC are both standard working voltages, 1.20 V and 2.50 V respectively. In the time period T2, when the working state of the memory system is the deep sleep state of the light-load working state, VCC is 0 V, while the lower limit working voltage of VCCQ corresponding to the sleep state is 1.14 V.

When the memory system is in the light-load working state, the power consumption of the memory system may be reduced by reducing the voltage provided to the memory system. However, once the processor sends the operating instruction to the memory system, such low power consumption state is broken; or when a garbage collection operation needs to be performed inside the memory system and the memory system feeds back state register information representing execution of the garbage collection operation, the memory system needs to transit from the light-load working state to the heavy-load working state, and therefore, the voltage required to be provided to the memory system is restored to the standard working voltage.

In one possible implementation, after reducing the voltage provided to the memory system, the method further comprises:

sending a second voltage adjustment instruction to the power management IC in response to at least one of the operating instruction sent to the memory system or the state information fed back by the memory system being the heavy-load working state, wherein the second voltage adjustment instruction is configured to instruct the power management IC to adjust the voltage provided to the memory system from the lower limit working voltage to the standard working voltage.

In an example, continuing the illustration with the memory system as the UFS, the voltage provided to the UFS comprises both VCCQ and VCC. When the working state of the memory system is the deep sleep state of the light-load working state, the voltages provided by VCCQ and VCC are both lower limit working voltages corresponding to the deep sleep state, and may be 1.14 V and 2.40 V respectively. After the power management IC receives the second voltage adjustment instruction, the voltage provided to the memory system needs to be adjusted from the lower limit working voltage to the standard working voltage, i.e., the voltages provided to VCCQ and VCC are increased to 1.20 V and 2.50 V.

Based on the above adjustment process, whether the relevant solution employs the dynamic voltage adjustment solution of the present disclosure may be determined by detecting whether the voltage provided to the memory system has periodic magnitude variation.

Therefore, in practical applications, a tradeoff is needed between energy saving and performance. The memory system may switch between a low power consumption state and a high performance state as required to ensure that the energy efficiency and performance requirements are balanced in different working loads. In an example, the lower limit working voltage provided to the memory system in the light-load working state may be 95% of the standard working voltage provided to the memory system in the heavy-load working state, thereby bringing 5% power saving to the memory system.

Figure 9:
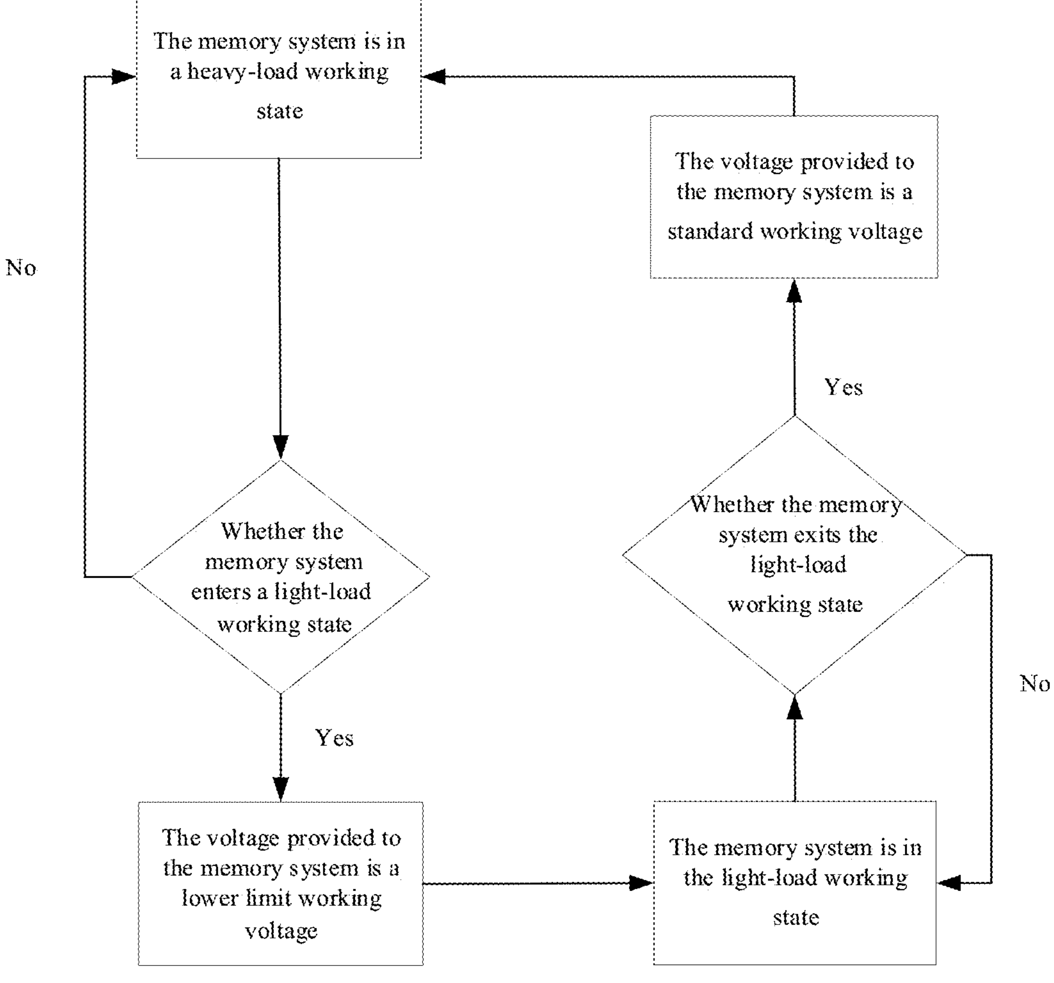
FIG. 9 is a logic block diagram of a method of voltage regulation provided by examples of the present disclosure.
Figure 10:
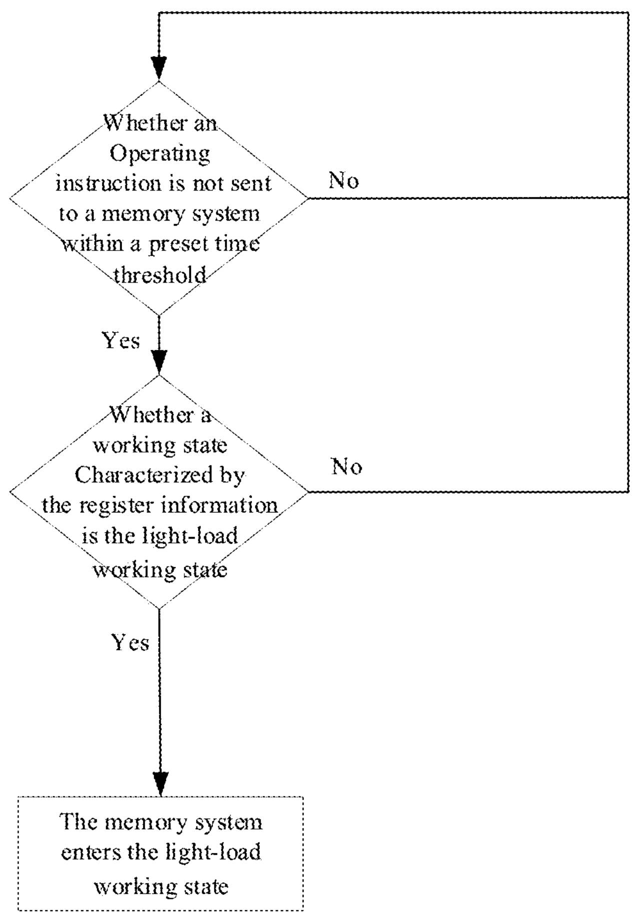
FIG. 10 is a logic block diagram of another method of voltage regulation provided by examples of the present disclosure.
Figure 11:
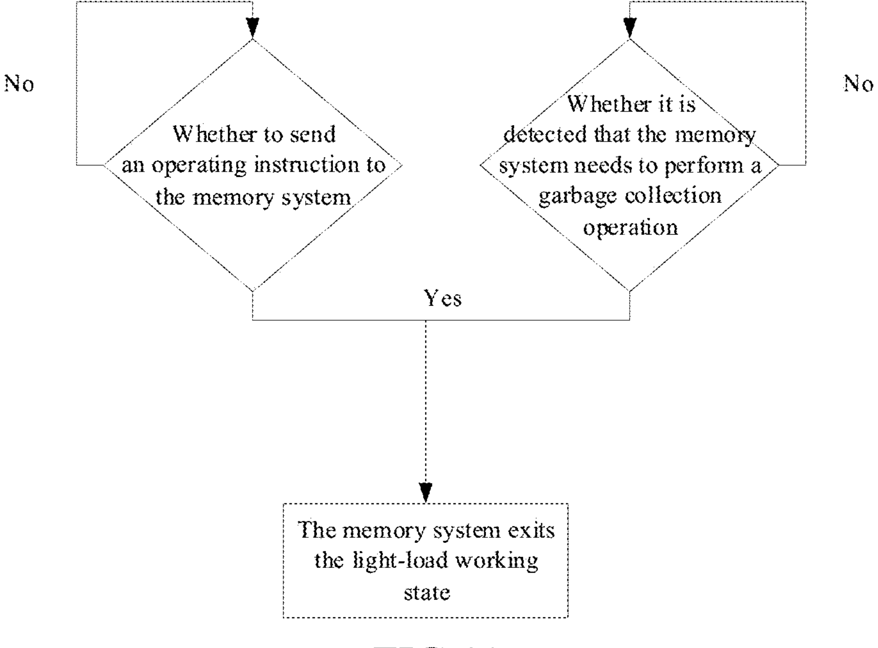
FIG. 11 is a logic block diagram of another method of voltage regulation provided by examples of the present disclosure.

The dynamic voltage adjustment process of the present disclosure will be illustrated below in conjunction with FIG. 9. The processor judges the working state of the memory system at any time. When the memory system performs the data read, write and erase operations, the memory system is in the heavy-load working state, and the voltage provided to the memory system is the standard working voltage. FIG. 10 shows a judgment process that the processor judges that the memory system enters the light-load working state. When the operating instruction is not sent to the memory system within the preset time threshold, and the working state characterized by the register information is the light-load working state, the voltage provided to the memory system is changed from the standard working voltage to the lower limit working voltage, and the whole memory system is in the light-load working state at this point. FIG. 11 shows a judgment process that the memory system exits the light-load working state. Once the processor sends the operating instruction to the memory system or the processor detects that the memory system needs to perform the garbage collection operation, the memory system needs respective data read, write and erase operations. Therefore, the memory system needs to exit the light-load working state, and the voltage provided to the memory system is changed from the lower limit working voltage to the standard working voltage.

According to the method of voltage regulation provided by the present disclosure, the processor actively detects the working state of the memory system and dynamically regulates the voltage provided to the memory system according to the working state of the memory system. Therefore, when the memory system is in the light-load working state, the power consumption of the memory system may be reduced by reducing the voltage provided to the memory system so as to achieve an effect of dynamically reducing overall power consumption of the electronic apparatus. Moreover, whether an effect of reducing the power consumption of the memory system is achieved by dynamically regulating the voltage provided to the memory system may be judged by detecting variation of the voltage provided to the memory system.

Examples of the present disclosure further provide an electronic apparatus, for example, the electronic apparatus 10 as shown in aforementioned FIG. 1, which comprises a memory system 110, and at least one processor 1001, wherein the at least one processor 1001 is coupled with the memory system, and is configured to: acquire a current working state of the memory system, wherein the working state comprises a light-load working state and a heavy-load working state, and reduce a voltage provided to the memory system in response to the current working state being the light-load working state.

In some examples, the electronic apparatus 10 further comprises a power management IC 1002 coupled with the at least one processor 1001, wherein the at least one processor 1001 is configured to send a first voltage adjustment instruction to the power management IC, wherein the first voltage adjustment instruction is to instruct the power management IC to reduce the voltage provided to the memory system from a standard working voltage to a lower limit working voltage.

In some examples, the electronic apparatus further comprises a power management IC 1002 coupled with the at least one processor 1001, wherein the at least one processor 1001 is configured to send a first voltage adjustment instruction to the power management IC, and the power management IC 1002 is configured to reduce the voltage provided to the memory system from a standard working voltage to a lower limit working voltage in response to the first voltage adjustment instruction.

In some examples, the voltage provided to the memory system comprises a first power supply voltage provided to the memory controller and a second power supply voltage provided to the memory, and the power management IC 1002 is configured to reduce the first power supply voltage provided to the memory controller from a standard working voltage of the first power supply voltage to a lower limit working voltage of the first power supply voltage, and reduce the second power supply voltage provided to the memory from a standard working voltage of the second power supply voltage to a lower limit working voltage of the second power supply voltage.

In some examples, the power management IC 1002 is configured to reduce the second power supply voltage provided to the memory from the standard working voltage of the second power supply voltage to zero, and reduce the first power supply voltage provided to the memory controller from the standard working voltage of the first power supply voltage to the lower limit working voltage of the first power supply voltage.

In some examples, the at least one processor 1001 is configured to acquire the current working state of the memory system in response to not sending an operating instruction to the memory system within a preset time threshold, wherein the operating instruction is to instruct the memory system to enter the heavy-load working state.

In some examples, the at least one processor 1001 is configured to send a state information acquisition instruction to the memory system, and acquire state information fed back by the memory system; and determine the working state of the memory system according to the state information.

In some examples, the at least one processor 1001 is further configured to send a second voltage adjustment instruction to the power management IC in response to at least one of the operating instruction sent to the memory system or the state information fed back by the memory system being the heavy-load working state, wherein the second voltage adjustment instruction is configured to instruct the power management IC to adjust the voltage provided to the memory system from the lower limit working voltage to the standard working voltage.

In some examples, the light-load working state comprises a plurality of sub-working states including a standby state, a hibernate state, an idle state, a sleep state and a deep sleep state, wherein lower limit working voltages corresponding to different ones of the sub-working states are different.

Those skilled in the art can clearly appreciate that, for ease and simplicity of description, in the above examples, the descriptions of various examples have their own emphases, and the portions of some example that are not described in detail may be referred to a corresponding process in the aforementioned method examples, which is no longer repeated here.

In several examples provided by the present disclosure, it should be understood that the provided programming method and memory may be implemented by other manners. For example, the division of some module is only division for logical functions. In actual implementations, there may be other methods for division. For example, a plurality of units or components may be combined, or may be integrated into another system, or some features can be omitted or not performed.

Those of ordinary skill in the art can recognize that the modules and algorithm steps of various examples as described in conjunction with the examples disclosed herein can be implemented in an electronic hardware, or a combination of a computer software and an electronic hardware. Whether these functions are performed by means of a hardware or a software depends on particular applications and design constraints of the technical solution. Professional technicians can implement the described function using different methods for each particular application, but such implementation should not be considered as exceeding the scope of the present disclosure.

The above descriptions are merely specific implementations of the present disclosure, and the protection scope of the present disclosure is not limited to those. Any variation or replacement that may be readily figured out by those skilled in the art within the technical scope disclosed by the present disclosure shall fall within the protection scope of the present disclosure. Therefore, the protection scope of the present disclosure shall be defined by the protection scope of the claims.

What is claimed is:

1. A method of voltage regulation, wherein the method of voltage regulation is applied to an electronic apparatus comprising a memory system, and comprises:

acquiring, through a processor directly coupled to the memory system, a current working state of the memory system, wherein the current working state comprises a light-load working state and a heavy-load working state; and reducing, by adjusting a first power supply voltage provided to a memory controller of the memory system and a second power supply voltage provided to a memory of the memory system, a voltage directly provided to the memory system in response to the current working state being the light-load working state.

2. The method of claim 1, wherein the electronic apparatus further comprises a power management IC, and the reducing the voltage provided to the memory system comprises:

sending a first voltage adjustment instruction to the power management IC; and reducing the voltage provided to the memory system from a standard working voltage to a lower limit working voltage by the power management IC in response to the first voltage adjustment instruction.

3. The method of claim 2, wherein the reducing the voltage provided to the memory system from the standard working voltage to the lower limit working voltage comprises:

reducing the first power supply voltage provided to the memory controller from a standard working voltage of the first power supply voltage to a lower limit working voltage of the first power supply voltage, and reducing the second power supply voltage provided to the memory from a standard working voltage of the second power supply voltage to a lower limit working voltage of the second power supply voltage, by the power management IC.

4. The method of claim 3, wherein the reducing the voltage provided to the memory system from the standard working voltage to the lower limit working voltage further comprises:

reducing the second power supply voltage provided to the memory from the standard working voltage of the second power supply voltage to zero, and reducing the first power supply voltage provided to the memory controller from the standard working voltage of the first power supply voltage to the lower limit working voltage of the first power supply voltage, by the power management IC.

5. The method of claim 1, wherein before the acquiring the current working state of the memory system, the method further comprises:

acquiring the current working state of the memory system in response to not sending an operating instruction to the memory system within a preset time threshold, wherein the operating instruction is to instruct the memory system to enter the heavy-load working state.

6. The method of claim 1, wherein the acquiring the current working state of the memory system comprises:

sending a state information acquisition instruction to the memory system, and acquiring state information fed back by the memory system; and determining the current working state of the memory system according to the state information.

7. The method of claim 6, wherein after the reducing the voltage provided to the memory system, the method further comprises:

sending a second voltage adjustment instruction to a power management IC in response to at least one operating instruction sent to the memory system or the state information fed back by the memory system being the heavy-load working state; and adjusting the voltage provided to the memory system from a lower limit working voltage to a standard working voltage by the power management IC in response to the second voltage adjustment instruction.

8. The method of claim 1, wherein the light-load working state comprises a plurality of sub-working states including a standby state, a hibernate state, an idle state, a sleep state and a deep sleep state, wherein lower limit working voltages corresponding to different ones of the sub-working states are different.

9. An electronic apparatus, comprising:

a memory system; and at least one processor coupled with the memory system, wherein the at least one processor is configured to:

acquire, through a processor directly coupled to the memory system, a current working state of the memory system, wherein the current working state comprises a light-load working state and a heavy-load working state; and reduce, by adjusting a first power supply voltage provided to a memory controller of the memory system and a second power supply voltage provided to a memory of the memory system, a voltage directly provided to the memory system in response to the current working state being the light-load working state.

10. The electronic apparatus of claim 9, wherein the electronic apparatus further comprises a power management IC coupled with the at least one processor, and the at least one processor is configured to:

send a first voltage adjustment instruction to the power management IC; and the power management IC is configured to:

reduce the voltage provided to the memory system from a standard working voltage to a lower limit working voltage in response to the first voltage adjustment instruction.

11. The electronic apparatus of claim 10, wherein the power management IC is configured to:

reduce the first power supply voltage provided to the memory controller from a standard working voltage of the first power supply voltage to a lower limit working voltage of the first power supply voltage, and reduce the second power supply voltage provided to the memory system from a standard working voltage of the second power supply voltage to a lower limit working voltage of the second power supply voltage.

12. The electronic apparatus of claim 11, wherein the power management IC is further configured to:

reduce the second power supply voltage provided to the memory from the standard working voltage of the second power supply voltage to zero, and reduce the first power supply voltage provided to the memory controller from the standard working voltage of the first power supply voltage to the lower limit working voltage of the first power supply voltage.

13. The electronic apparatus of claim 9, wherein the at least one processor is further configured to:

acquire the current working state of the memory system in response to not sending an operating instruction to the memory system within a preset time threshold, wherein the operating instruction is to instruct the memory system to enter the heavy-load working state.

14. The electronic apparatus of claim 9, wherein the at least one processor is configured to:

send a state information acquisition instruction to the memory system, and acquire state information fed back by the memory system; and determine the current working state of the memory system according to the state information.

15. The electronic apparatus of claim 14, wherein the at least one processor is further configured to:

send a second voltage adjustment instruction to a power management IC in response to at least one operating instruction sent to the memory system or the state information fed back by the memory system being the heavy-load working state; and the power management IC is further configured to:

adjust the voltage provided to the memory system from a lower limit working voltage to a standard working voltage in response to the second voltage adjustment instruction.

16. The electronic apparatus of claim 9, wherein the light-load working state comprises a plurality of sub-working states including a standby state, a hibernate state, an idle state, a sleep state and a deep sleep state, wherein lower limit working voltages corresponding to different ones of the sub-working states are different.

17. A non-transitory, computer readable storage medium, comprising a program stored therein, wherein the program is executable to control an electronic apparatus comprising a memory system where the non-transitory computer readable storage medium is located to perform operations comprising:

acquiring, through a processor directly coupled to the memory system, a current working state of the memory system, wherein the current working state comprises a light-load working state and a heavy-load working state; and reducing, by adjusting a first power supply voltage provided to a memory controller of the memory system and a second power supply voltage provided to a memory of the memory system, a voltage directly provided to the memory system in response to the current working state being the light-load working state.

18. The non-transitory, computer readable storage medium of claim 17, wherein before the acquiring the current working state of the memory system, the operations further comprises:

acquiring the current working state of the memory system in response to not sending an operating instruction to the memory system within a preset time threshold, wherein the operating instruction is to instruct the memory system to enter the heavy-load working state.

19. The non-transitory, computer readable storage medium of claim 17, wherein the acquiring the current working state of the memory system comprises:

sending a state information acquisition instruction to the memory system, and acquiring state information fed back by the memory system; and determining the current working state of the memory system according to the state information.

20. The non-transitory, computer readable storage medium of claim 19, wherein after the reducing the voltage provided to the memory system, the operations further comprise:

sending a second voltage adjustment instruction to a power management IC in response to at least one operating instruction sent to the memory system or the state information fed back by the memory system being the heavy-load working state; and adjusting the voltage provided to the memory system from a lower limit working voltage to a standard working voltage by the power management IC in response to the second voltage adjustment instruction.

* * * * *